United States Patent [19]

Sato et al.

[11] Patent Number: 4,928,074
[45] Date of Patent: May 22, 1990

[54] AUTOMATIC GAIN CONTROL CIRCUIT

[75] Inventors: Mitsuru Sato; Tetsuya Iizuka; Kiyoshi Furuya; Norio Shoji; Masato Sekine, all of Kanagawa, Japan

[73] Assignee: Sony Corporation, Tokyo, Japan

[21] Appl. No.: 365,672

[22] Filed: Jun. 13, 1989

[30] Foreign Application Priority Data

Jun. 17, 1988 [JP] Japan .................. 63-149436

[51] Int. Cl.⁵ .............................................. H03F 3/45
[52] U.S. Cl. ...................................... 330/254; 330/279
[58] Field of Search ............... 330/252, 254, 257, 260, 330/261, 278, 279

[56] References Cited

U.S. PATENT DOCUMENTS 4,124,825  11/1978  Webb et al. ..................... 330/279
4,651,210   3/1987  Olson .......................... 330/254 X Primary Examiner—Steven Mottola
Attorney, Agent, or Firm—Lewis H. Eslinger; Jay H. Maioli

[57] ABSTRACT

An automatic gain control circuit having a variable gain amplifier circuit, a signal level detecting circuit connected to the variable gain amplifier circuit for generating a detect signal the level of which changes in response to a signal level of an output signal of the variable gain amplifier circuit, and a gain control circuit for controlling the gain of the variable gain amplifier circuit in accordance with the signal level of the detect signal, and the gain control circuit having a differential amplifier circuit having first and second input terminals, the first and second input terminals being connected to the signal level detecting circuit for receiving the detect signal, a first reference voltage source connected to the first input terminal of the differential amplifier so that a first predetermined voltage is provided instead of the signal level of the detect signal in response to the signal level of the detect signal and a second reference voltage source connected to the second input terminal of the differential amplifier for providing a second predetermined voltage.

7 Claims, 5 Drawing Sheets

AUTOMATIC GAIN CONTROL CIRCUIT

BACKGROUND OF THE INVENTION

1. Field of the Invention

The present invention relates generally to an automatic gain control circuit and, more particularly, is directed to a gain controlled amplifying circuit whose gain is controlled by the automatic gain control circuit.

2. Description of the Prior Art

Prior to "BRIEF DESCRIPTION OF THE DRAWINGS", let us first explain an example of the prior art with reference to the drawings in order to understand the problems inherent in the prior art more clearly.

Figure 1:
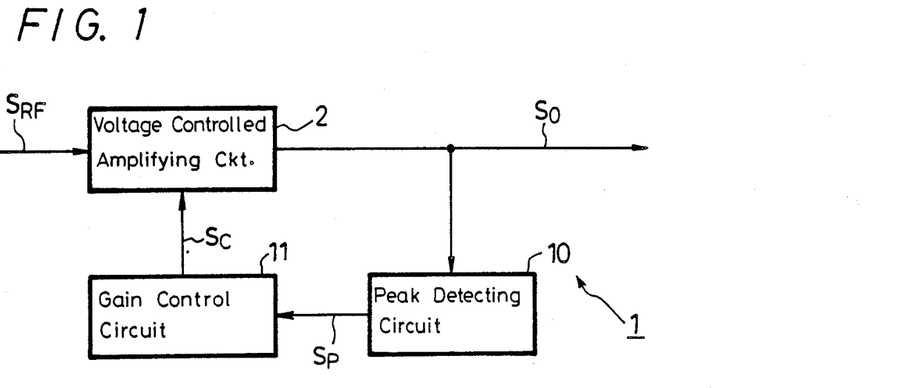
FIG. 1 is a schematic block diagram showing an example of an automatic gain control circuit in the prior art.

A prior-art magnetic disk apparatus utilizes an automatic gain control circuit to correct a reproduced signal from a magnetic head so that it may fall within a predetermined signal level range. FIG. 1 is a block diagram showing a prior-art feedback-type automatic gain control circuit which is generally designated by reference numeral 1.

As shown in FIG. 1, a reproduced signal $S_{RF}$ from, for example, a magnetic disk (not shown) or the like is supplied to a voltage controlled amplifying circuit 2. The voltage controlled amplifying circuit 2 will be described in detail with reference to FIG. 2.

Figure 2:
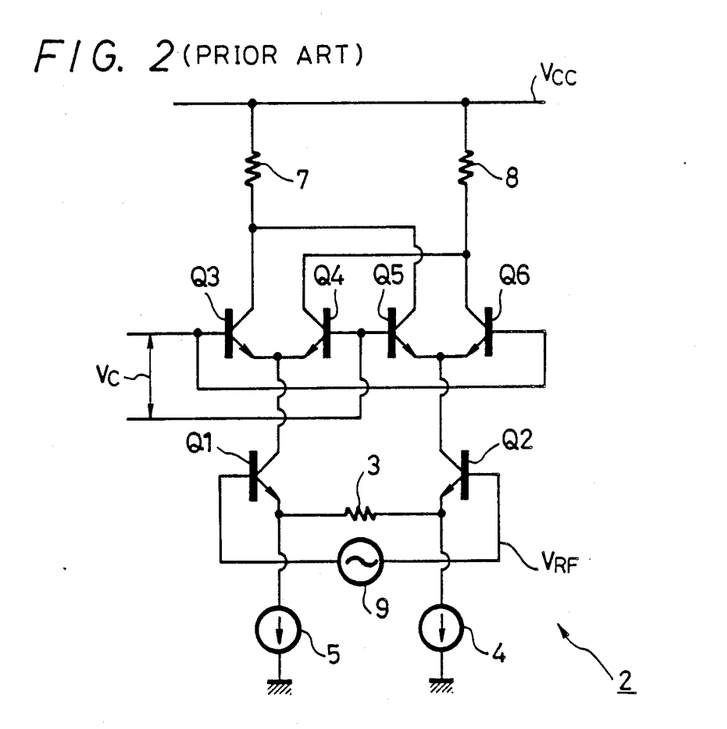
FIG. 2 is a diagram showing an example of a prior-art voltage controlled amplifying circuit used in the automatic gain control circuit shown in FIG. 1.

Referring to FIG. 2, it will be seen that the voltage controlled amplifying circuit 2 is comprised of transistors Q1, Q2 connected in a differential amplifying circuit configuration and transistors Q3, Q4 and Q5, Q6, each transistor pair being connected in a differential amplifying circuit configuration. The output currents of the transistors Q1 and Q2 are respectively supplied to the emitters of the transistors Q3, Q4 and to the emitters of the transistors Q5, Q6, thus resulting in a multiplying circuit arrangement being formed.

The emitters of the transistors Q1 and Q2 are connected by a resistor 3, and are respectively connected to constant current sources 4 and 5 and an input signal is supplied to their bases.

A control voltage Vc is supplied to the bases of the transistors Q3, Q4 and of the transistors Q5, Q6, and load resistors 7 and 8 are commonly connected to the collectors of the transistors Q3, Q5 and to the collectors of the transistors Q4, Q6, respectively.

Figure 3:
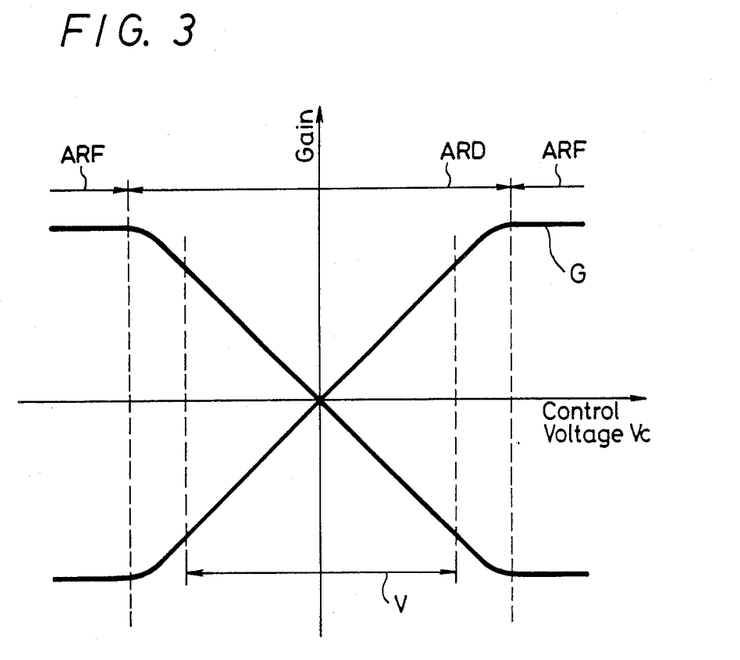
FIG. 3 is a graphical representation useful for explaining input/output characteristics of the voltage controlled amplifying circuit shown in FIG. 2.

Thus, when a signal source 9 having a voltage $V_{RF}$ is connected between the bases of the transistors Q1 and Q2, as shown in FIG. 3, the voltage controlled amplifying circuit 2 generates as a terminal voltage across the load resistors 7 and 8 an output signal which is amplified by a gain G given by the following equation $$G = \frac{1}{1 + \exp(V_c/V_T)} \cdot \frac{R_L}{R_E} \quad (1)$$

where $R_E$ is the resistance value of the resistor 3 and $R_L$ is the resistance value of the load resistors 7 and 8.

In this case, $V_T$ represents the thermal voltage of each of the transistors Q1, Q2, Q3, Q4, Q5 and Q6 and is expressed by the following equation $$V_T = \frac{kT}{q} \quad (2)$$

where k is the Boltzman's constant, T is the absolute temperature and q is the charge of an electron.

Thus, when the reproduced signal $S_{RF}$ instead of the signal from the signal source 9 is supplied to the transistors Q1 and Q2 and the control voltage Vc is controlled in response to the level of the reproduced signal $S_{RF}$, the voltage controlled amplifying circuit 2 can generate the output signal having a predetermined level.

To be more concrete, referring back to FIG. 1, an output signal $S_0$ of the voltage controlled amplifying circuit 2 is supplied to a peak detecting circuit 10, and a detected signal $S_P$ from the peak detecting circuit 10 is supplied to a gain control circuit 11.

The gain control circuit 11 generates a control signal $S_C$ whose level changes with the level of the detected signal $S_p$. This control signal $S_C$ is supplied to the voltage controlled amplifying circuit 2 as a control voltage Vc.

Even when the signal level of the reproduced signal $S_{RF}$ fluctuates or pulses, it is possible to obtain an output signal $S_0$ whose signal level is at a predetermined level.

Figure 4A:
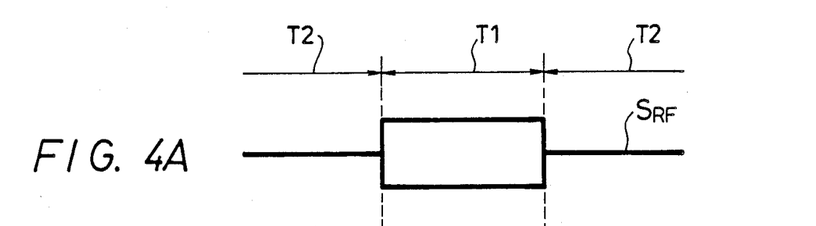
FIGS. 4A and 4B are waveform diagrams used to explain the defects encountered with the prior art.

The reproduced signal $S_{RF}$ from the magnetic head is so selected that its signal level rises up from zero at every predetermined period as shown in FIG. 4A.

During a time period T1 in which the reproduced signal $S_{RF}$ goes to a high level, the control signal $S_C$ changes in an region ARD (hereinafter, referred to as an operation region) in which the gain G of the voltage controlled amplifying circuit 2 changes substantially linearly relative to the control voltage Vc so that the output signal $S_0$ is controlled to have a predetermined signal level, as shown in FIG. 3. During a time period T2 in which the signal level of the reproduced signal $S_{RF}$ is zero, the control signal $S_C$ is displaced beyond the operation region ARD up to a region ARF (hereinafter, referred to as a saturation region) in which the gain G is not changed even when the control voltage $V_C$ is changed.

Figure 4B:
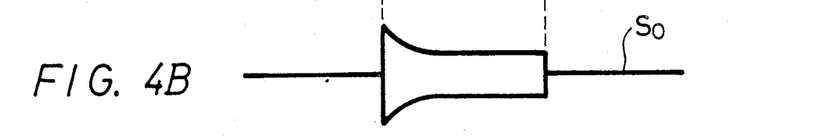

There is then presented such a problem that immediately after the reproduced signal $S_{RF}$ goes to a high level from zero, an over-shoot occurs in the envelope of the output signal $S_0$ as shown in FIG. 4B during the period in which the signal level of the control signal $S_C$ goes to a predetermined level in the operation region ARD from the saturation region ARF.

To solve the above-mentioned problem, the following proposals are made, which are disclosed in Japanese Patent Publications Nos. 61-61570 and 61-61726. According to these proposals, during the time period T2 in which the signal level of the reproduced signal $S_{RF}$ is zero level, the gain G is maintained to a predetermined value by controlling the control signal $S_C$ to have a predetermined level, whereby a period (hereinafter, referred to as an attack time) in which the signal level of the reproduced signal $S_{RF}$ rises from zero level and the signal level of the output signal $S_0$ falls to a predetermined level is reduced.

As described above, the control signal $S_c$ is maintained to have the predetermined level and the displacement of the control signal $S_C$ is sufficiently reduced around a time at which the signal level of the reproduced signal rises. Thus, it is possible to obtain an automatic gain control circuit which can reduce the duration of the attack time.

In the voltage controlled amplifying circuit 2 of the multiplying circuit arrangement, the range of the operation region ARD is as small as about 50 mV from the center voltage of the control voltage $V_C$. The problem is then presented that the gain G cannot be controlled to a predetermined value by keeping the control signal $S_C$ at a predetermined level. The prior art cannot therefore be applied to this kind of voltage controlled amplifier circuit 2.

Figure 5:
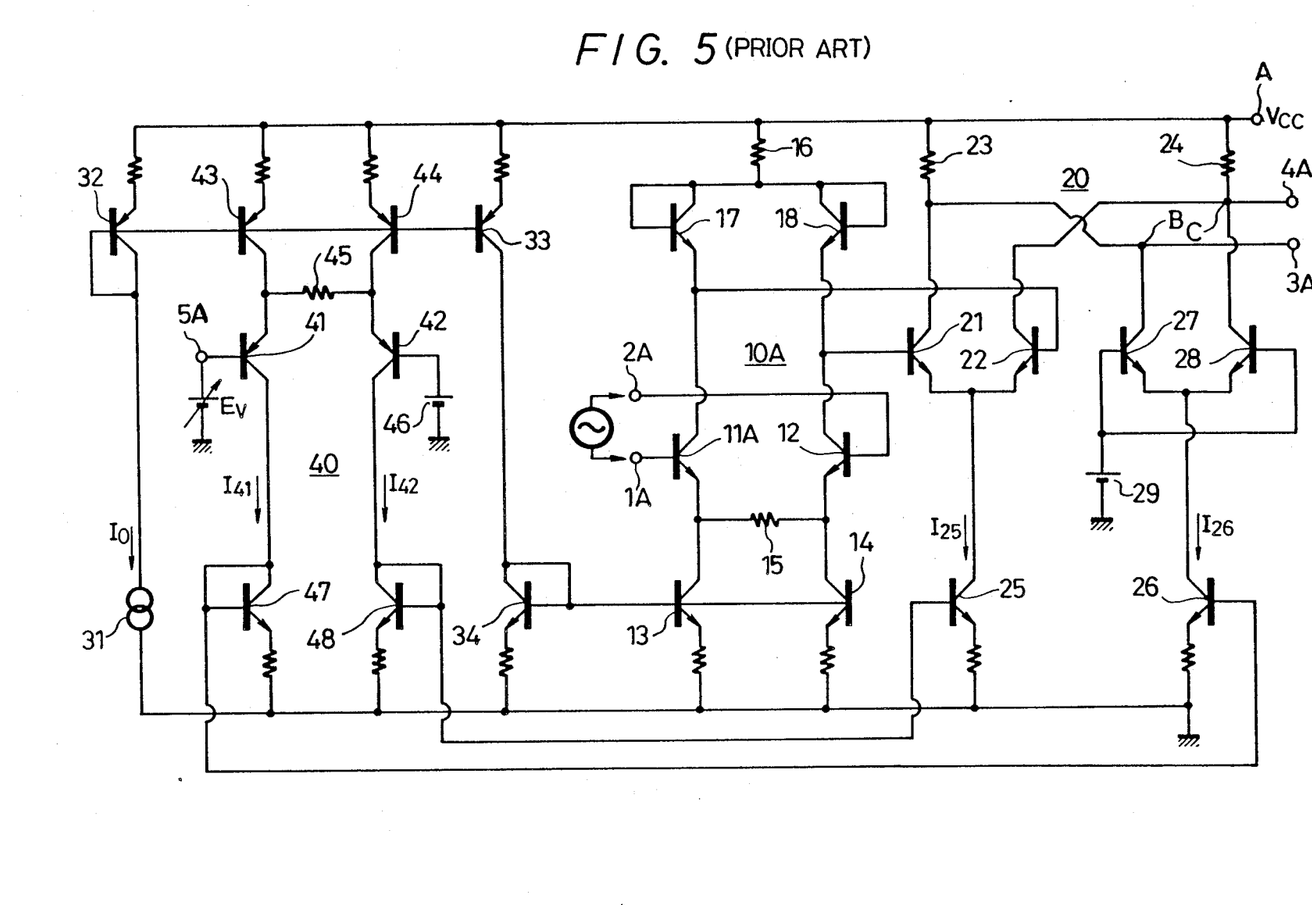
FIG. 5 is a diagram showing an example of another proposal of a prior-art gain controlled amplifier.

FIG. 5 shows another proposal of a prior-art gain control amplifier in which a fixed gain differential amplifier 10A and a variable gain differential amplifier 20 are connected in cascade and the gain is controlled by varying the operation current of the second stage of the differential amplifier 20 by a control voltage $E_V$.

Referring to FIG. 5, it will be seen that balance-type input terminals 1A and 2A supplied with, for example, a video signal are respectively connected to the bases of a pair of npn transistors 11 and 12 forming the differential amplifier 10A of the first stage. The emitters of the npn transistors 11A and 12 are respectively grounded via npn transistors 13 and 14 each serving as a constant current source, and a resistor 15 is connected between the emitters of the transistors 11A and 12. The collectors of the transistors 11A and 12 are connected through npn transistors 17, 18 connected in a diode fashion and a common resistor 16 to a terminal A to which a voltage Vcc is supplied.

The collectors of the transistors 11A and 12 forming the differential amplifier 10A are directly connected to the bases of a pair of npn transistors 21 and 22 forming the second stage of the differential amplifier 20. The voltage Vcc applied to the terminal A is supplied to the collectors of the transistors 21 and 22 through load resistors 23 and 24, respectively, while the emitters of the transistors 21 and 22 are grounded via a transistor 25 serving as a common constant current source. Similarly, the emitters of a pair of transistors 27 and 28 are grounded via a transistor 26 serving as a common constant current source, and a common constant voltage source 29 is connected to the bases of the transistors 27 and 28. The collectors of the transistors 27 and 28 are connected to the collectors of the transistors 21 and 22 to provide junctions B and C, respectively. Output terminals 3A and 4A are derived from the junctions B and C, respectively. The junction area of each of the transistors 25 and 26 is selected to be twice the junction area of each of the transistors 21, 22 and 27, 28.

The circuit in FIG. 5 also provides a reference constant current source 31 whose one end is grounded. The other end of the reference constant current source 31 is connected to a pnp transistor 32 connected in a diode fashion to the terminal A. The transistor 32 and a pnp transistor 33 connected to the former in a current mirror fashion and an npn transistor 34 connected in a diode fashion are serially connected between the terminal A and the ground. The transistor 34 is also connected to the transistors 13 and 14 forming the differential amplifier 10A in a current mirror fashion to form a constant current circuit.

In FIG. 5, reference numeral 40 designates a current control circuit. In the current control circuit 40, the emitters of a pair of pnp transistors 41 and 42 are connected to the terminal A through pnp transistors 43 and 44 each serving as a constant current source. A resistor 45 is connected between the emitters of the transistors 41 and 42. A variable control voltage source $E_V$ is connected through a control terminal 5A to the base of the transistor 41, whereas a constant voltage source 46 is connected to the base of the transistor 42. The collectors of the pnp transistors 41 and 42 are respectively grounded via npn transistors 47 and 48 connected in a diode fashion, and are further connected to the bases of the transistors 25 and 26 forming the next stage of the differential amplifier 20. The transistors 43 and 44 are connected to the diode-connected transistor 32 connected in a current mirror fashion.

With the above-mentioned circuit arrangement, the transistors 13 and 14 in the first differential amplifier 10A are connected to the transistor 32 through the transistors 34 and 33 in a double current mirror fashion, whereby a constant current equal to a reference current $I_0$ of the constant current source 31 is flowed to the transistors 13 and 14.

When the control signal $E_V$ from the terminal 5A and a voltage $E_{46}$ from the voltage source 46 are equal, the collector currents $I_{41}$ and $I_{42}$ of the transistors 41 and 42 are equal to the reference constant current of the constant current source 31. This gives $I_{41}=I_{42}=I_0$. In that event, the transistors 26 and 25 in the second differential amplifier 20, which form a current mirror circuit with the transistors 47 and 48, produce collector currents, expressed as $I_{26}=I_{25}=2I_0$.

The collector currents $I_{41}$ and $I_{42}$ of the transistors 41 and 42 in the current control circuit 40 are differentially changed in response to the change of the control voltage $E_V$, whereby the collector currents $I_{26}$ and $I_{25}$ of the constant current source transistors 26 and 25 in the differential amplifier 20 are changed by the same ratios.

Assuming that resistance values of the load resistors 23 and 24 in the differential amplifier 20 are represented as $R_{23}=R_{24}=R_{20}$ and that the resistance value of the resistor 15 in the first differential amplifier 10A is represented as $R_{15}$, then the gain G from the input terminals 1A, 2A to the output terminals 3A, 4A is expressed as given by the following equation (3)

$$G = \frac{R_{20}}{R_{15}} \cdot \frac{I_{25}}{I_0} \quad (3)$$

The fluctuation of direct current (DC) voltage components with the change of the operation current $I_{25}$ of the transistor pair 21 and 22 is cancelled out by the fluctuation of DC voltage component with the reverse direction change of the operation current $I_{26}$ of the other transistor pair 27 and 28. Thus, the levels of the DC voltage components appearing at the terminals 3A and 4A can be kept constant.

In the first differential amplifier 10A and the current control circuit 40, the resistors 15 and 45 are respectively connected between the emitters of the transistors 11A, 12 and 41, 42 so that linearity and dynamic range of the voltage controlled amplifier are improved as compared with the fundamental circuit arrangement in which the respective emitters of the transistors are directly connected.

In the prior-art gain controlled amplifier shown in FIG. 5, as described before, the transistors 13 and 14 in the first differential amplifier 10A constitute a double current mirror circuit together with the transistors 32 to 34, whereby a constant current equal to the reference current $I_0$ of the constant current source 31 flows therethrough. The transistors 25 and 26 in the second differential amplifier 20 similarly forms the double current mirror circuit by interposing the transistors 43, 47 and 44, 48 between the transistors 25, 26 and the transistor 32.

Since the pnp transistors 41 and 42 are interposed in the middle stage of the double current mirror circuit, the characterstics such as $h_{FE}$ and the like of both the transistors 41 and 42 affect the operation currents $I_{25}$ and $I_{26}$ of the transistor pairs 21, 22 and 27, 28 of the differential amplifier 20, thus resulting in the gain G from the terminals 1A, 2A to the terminals 3A, 4A fluctuating.

If $h_{FE}$ of the transistors 41 and 42 fluctuates in a range of from, for example, the central value 60 to the minimal value 20, then the gain G fluctuates by, for example, about 0.4 dB. Thus, there is almost no way a tolerance of, for example, 0.5 dB can be obtained.

OBJECTS AND SUMMARY OF THE INVENTION

It is an object of the present invention to provide an automatic gain control circuit which can reduce an attack time even when a voltage controlled amplifying circuit of a multiplying circuit arrangement is employed.

It is another object of the present invention to provide a gain controlled amplifier which prevents total gain fluctuation and maintains a more stable in operation.

According to an aspect of the present invention, there is provided an automatic gain control circuit having
 a variable gain amplifier circuit;
 a signal level detecting circuit connected to the variable gain amplifier circuit for generating a detect signal the level of which changes in response to a signal level of an output signal of the variable gain amplifier circuit; and
 a gain control circuit for controlling a gain of the variable gain amplifier circuit in accordance with the signal level of said detect signal.

The gain control circuit includes
 a differential amplifier circuit having first and second input terminals, the first input terminal being connected to the signal level detecting circuit for receiving the detect signal;
 a first reference voltage source connected to the first input terminal of the differential amplifier so that a first predetermined voltage is provided instead of the signal level of the detect signal in response to the signal level of the detect signal; and
 a second reference voltage source connected to the second input terminal of the differential amplifier for providing a second predetermined voltage.

The above, and other objects, features and advantages of the present invention will be apparent in the following detailed description of an illustrative embodiment of the present invention when read in conjunction with the accompanying drawings, in which the same reference numerals identify corresponding parts in the several views.

DETAILED DESCRIPTION OF A PREFERRED EMBODIMENT

An embodiment of an automatic gain control circuit according to the present invention will now be described with reference to the drawings.

Figure 6:
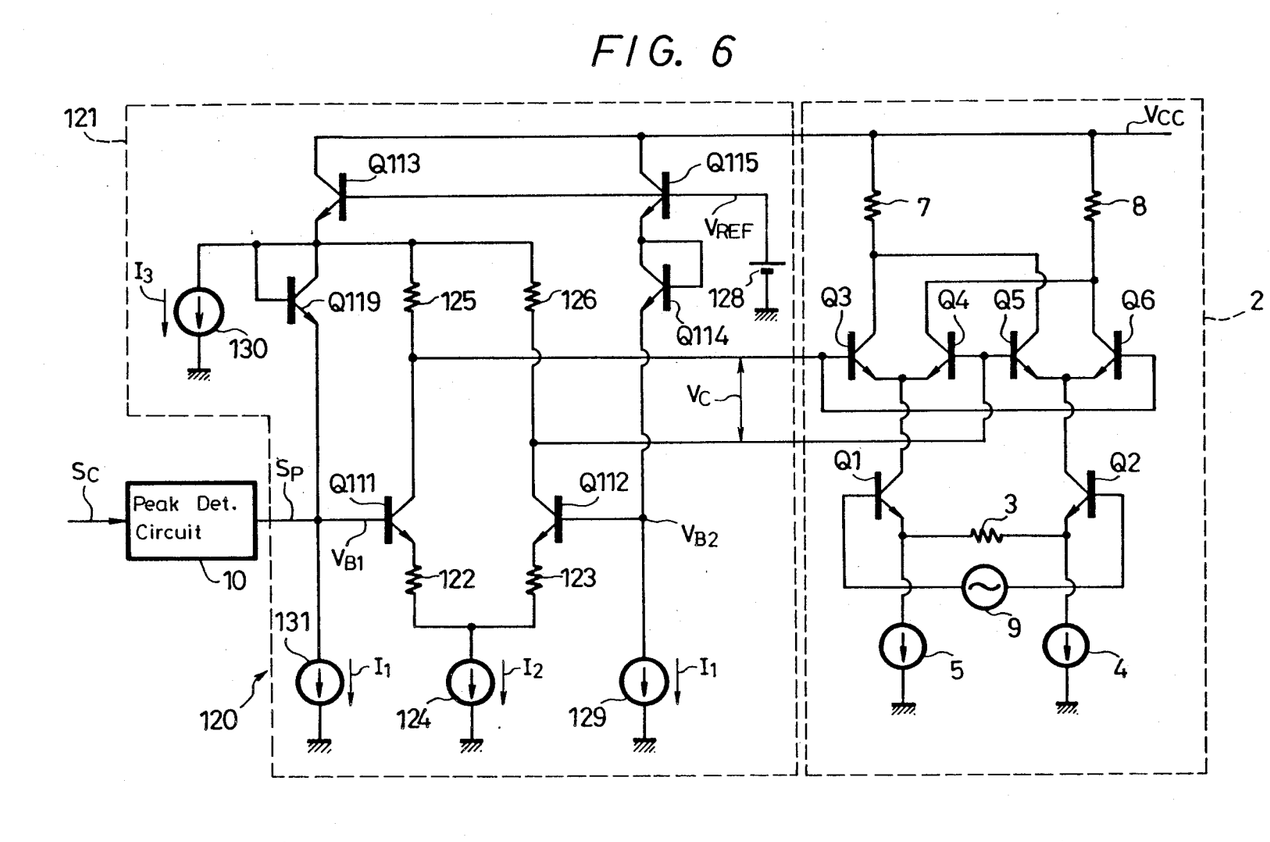
FIG. 6 is a diagram showing an embodiment of an automatic gain control circuit according to the present invention.

FIG. 6 shows an embodiment of the present invention. In FIG. 6, like parts corresponding to those of FIG. 2 are marked with the same references and therefore need not be described in detail.

Referring to FIG. 6, there is shown an automatic gain control circuit 120 which is integrated as a whole and in which a detected signal $S_P$ from the peak detecting circuit 10 (refer to FIG. 1) is supplied to a transistor Q111 in the gain control circuit 121.

A transistor Q112 forms the differential amplifying circuit together with the transistor Q111. The collector voltages of the transistors Q111 and Q112 are applied to the voltage controlled amplifying circuit 2 as the control voltage Vc.

More specifically, the emitters of the transistors Q111 and Q112 are connected through resistors 122 and 123 to a constant current source 124, while the collectors thereof are connected through load resistors 125 and 126 to the transistor Q113.

The base of the transistor Q113 is connected to a reference voltage source 128 having a reference voltage $V_{REF}$, whereby the emitter voltage of the transistor Q113 is held to be a voltage determined by the reference voltage $V_{REF}$. The voltage determined by the reference voltage $V_{REF}$ might be $V_{REF}-V_{BE3}$ where $V_{BE3}$ is the base-emitter voltage of the transistor Q113.

The base of the transistor Q112 is connected through a transistor Q114 connected in a diode fashion to the emitter of a transistor Q115 and is further connected to a constant current source 129.

The transistor Q115 is connected to the reference voltage source 128 similarly to the transistor Q113, whereby the base voltage $V_{B2}$ of the transistor Q112 is held to be voltages $V_{REF}-V_{BE4}-V_{BE5}$ where $V_{BE4}$ and $V_{BE5}$ are the base-emitter voltages of the transistors Q114 and Q115, respectively.

The constant current source 129 together with the transistoss Q114, Q115 and the reference voltage source 128 constitute a second current source which keeps a voltage $V_{B2}$ at a second input terminal of a differential amplifying circuit formed of the transistors Q111, Q112, the resistors 122, 123, 125 and 126 and the constant current source 124 to be predetermined voltage.

The control voltage Vc is expressed relative to a difference voltage between the signal level of the detected signal $S_P$ formed of the base voltage $V_{B1}$ of the transistor Q111 and the base voltage $V_{B2}$ of the transistor Q112 by the following equation (4)

$$V_C = (V_{B1} - V_{B2})\frac{R_{L1}}{R_{E1}} \qquad (4)$$

It is thus apparent from the equation (4) that if the reproduced signal $S_{RF}$ instead of the signal from the signal source 9 is supplied to the bases of transistors Q1 and Q2, then the output signal S₀ corrected to have the predetermined signal level can be produced across the load resistors 7 and 8.

Further, the base of the transistor Q111 is connected through a transistor Q119 connected in a diode fashion to the emitter of the transistor Q113 and a constant current source 130. The base of transistor Q11 is also directly connected to a constant current source 131.

The emitter voltage of the transistor Q113 is held as the voltage $V_{REF}-V_{BE3}$ that is determined by the reference voltage $V_{REF}$ so that when the level of the detected signal $S_P$ is higher than a voltage which is lowered from the emitter voltage $V_{REF}-V_{BE3}$ by the base-emitter voltage $V_{BE9}$ of the transistor Q119, the transistor Q119 is turned off. As a result, the base voltage $V_{B1}$ of the transistor Q111 is changed in accordance with the signal level of the detected signal $S_P$, whereby the output signal $S_0$ whose level is corrected to be a predetermined one can be produced.

When on the other hand the level of the detected signal $S_P$ is lowered, the transistor Q119 is turned on and the base voltage $V_{B1}$ of the transistor Q111 is held to be a predetermined voltage (voltage $V_{REF}-V_{BE3}-V_{BE9}$) determined by the reference voltage $V_{REF}$.

The constant current source 130 together with the transistors Q113, Q119, the constant current source 131 and the reference voltage source 128 constitute a first current source. This first current source is used to switch the voltage $V_{B1}$ at the first input terminal of the differential amplifying circuit formed of the transistors Q111 and Q112, the resistors 122, 123, 125 and 126 and the constant current source 124 from the signal level of the detected signal $S_P$ to the predetermined voltage in response to the signal level of the detected signal $S_P$.

The same current $I_1$ therefore flows to the transistors Q119 and Q114 connected to the bases of the transistors Q111 and Q112. Hence, assuming that the the base-emitter voltages of the transistors Q119 and Q114 are equal to each other, then between the bases of the transistors Q111 and Q112, there is produced a difference voltage expressed by the following equation $$V_{B1} - V_{B2} = (V_{REF} \text{ to } V_{BE3} - V_{BE9}) - \quad (5)$$
$$(V_{REF} - V_{BE5} - V_{BE4})$$
$$= V_{BE5} - V_{BE3}$$

At this time, in the transistors Q113 and Q115, the base-emitter voltages $V_{BE3}$ and $V_{BE5}$ thereof are varied in proportion to their emitter currents, respectively. In this case, currents $I_2$, $I_3$ and $I_1$ of the constant current sources 124, 130 and 131 and the current $I_1$ of the constant current source 129 flow to the transistors Q113 and Q115, respectively. This gives the following equations $$V_{BE3} = V_T \ln \frac{I_1 + I_2 + I_3}{I_S} \quad (6)$$

$$V_{BE5} = V_T \ln \frac{I_1}{I_S} \quad (7)$$

where $I_S$ is the reverse saturation current of the transistors Q113 and Q115. Substituting the above equations (6) and (7) into the equation (4) yields the modified equation expressed as $$V_C = \frac{R_{L1}}{R_{E1}} \left\{ \left( V_T \ln \frac{I_1 + I_2 + I_3}{I_S} \right) - V_T \ln \frac{I_1}{I_S} \right\} \quad (8)$$

$$= \frac{R_{L1}}{R_{E1}} \left( V_T \ln \frac{I_1 + I_2 + I_3}{I_1} \right)$$

When the signal level of the detected signal $S_P$ is lowered, the gain G of the voltage controlled amplifying circuit 2 is expressed by the following equations which result from substituting the equation (8) into the equation (1)

$$G = \frac{1}{1 + \exp\left(\frac{R_{L1}}{R_{E1}} \ln \frac{I}{I_1}\right)} \cdot \frac{R_L}{R_E} \quad (9)$$

$$I = I_1 + I_2 + I_3 \quad (10)$$

Herein, assuming the resistance values $R_{E1}$ and $R_{L1}$ of the emitter resistors 122, 123 and the load resistors 125, 126 are equal, then the gain G of the voltage controlled amplifying circuit 2 is held as the value expressed by the following equation $$G = \frac{I_1}{I_1 + I} \cdot \frac{R_L}{R_E} \quad (11)$$

Selecting the reference voltage $V_{REF}$ in response to the signal level of the detect signal $S_P$, the voltage controlled amplifying circuit 2 produces the output signal $S_0$ having the predetermined level during the time period T1 (see FIG. 4) where the signal level of the reproduced signal $S_{RF}$ rises. During the time period T2 where the signal level of the reproduced signal $S_{RF}$ falls, the voltage controlled amplifying circuit 2 produces the output signal $S_0$ which is amplified by the gain G expressed by the above equation (11).

Thus, selecting the current value $I_2$ or $I_3$ of the constant current source 124 or 130 relative to the current value $I_1$ of the constant current sources 129 and 131 on the basis of the equation (8), during the time period T2 in which the signal level of the reproduced signal $S_{RF}$ is lowered, the gain G of the voltage controlled amplifying circuit 2 can be held to a desired value.

The level of the control signal $S_C$ is held at a predetermined level by determining the currents of the constant current sources 124, 129, 130 and 131 in a desired current ratio and the voltage controlled amplifying circuit 2 can be maintained at the gain determined by the current ratio as described above. Thus, when the signal level of the reproduced signal $S_{RF}$ is lowered, the voltage controlled amplifying circuit 2 having the multiplying circuit configuration can hold its gain at a desired gain with high accuracy. The automatic gain control circuit 120 can further reduce its attack time.

The integrated circuit provides the current ratio of the constant current sources with very high accuracy. Hence, it is possible to obtain the automatic gain control circuit 120 which keeps a desired gain with very high accuracy and which can be suitably fabricated into the integrated circuit.

Controlling the automatic gain control circuit 120 to have a predetermined gain during the time period T2 in which the signal level of the reproduced signal $S_{RF}$ is lowered, it is possible to reduce a noise signal entering the signal processing circuit. This can prevent the magnetic disk apparatus from malfunctioning accordingly.

With the circuit arrangement as mentioned above, during the time period T1 (see FIG. 4A) in which the signal level of the reproduced signal $S_{RF}$ goes high, the transistor Q119 is turned off, whereby the difference signal between the signal level of the detected signal $S_P$ and the base voltage $V_{B2}$ of the transistor Q112 determined by the reference voltage $V_{REF}$ is amplified to produce the control signal $S_C$. The gain of the voltage controlled amplifying circuit 2 is as a result controlled on the basis of the control signal $S_C$.

During the time period T2 in which the signal level of the reproduced signal $S_{RF}$ goes low, the transistor Q119 is turned on, whereby a difference voltage between the emitter voltages of the transistors Q113 and Q115 is supplied to the transistors Q111 and Q112.

Since the difference voltage is proportional to the emitter currents of the transistors Q113 and Q115, it changes in response to the current values of the constant current sources 124, 130 and 131 relative to the constant current source 129, thus controlling the voltage controlled amplifying circuit 2 to have a gain determined by the current values of the constant current sources 124, 129, 130 and 131.

According to the above-mentioned circuit arrangement, during the time period T2 in which the signal level of the reproduced signal $S_{RF}$ goes low, the voltage controlled amplifying circuit 2 is controlled to have the gain determined by the current values of the constant current sources 124, 129, 130 and 131. Thus, the gain of the voltage controlled amplifying circuit 2 is therefore maintained with high accuracy. Thus, even when the voltage controlled amplifying circuit of the multiplier circuit arrangement is employed, it is possible to reduce the attack time.

While the resistors 125 and 126 and the transistor Q119 are connected to the transistor Q113 and the constant current source 130 as described above, the present invention is not limited to the above-mentioned circuit arrangement and can be applied to a wide variety of cases in which the resistors 125 and 126 are directly connected to the power source line instead of the transistor Q113 and the constant current source 130 and they are separately connected to a predetermined reference voltage source.

With the above-mentioned modification, the base-emitter voltage $V_{BE3}$ of the transistor Q113 is set to a voltage determined by the constant current sources 130 and 131.

While in the above embodiment the peak detecting circuit is used as the signal level detecting circuit for correcting the signal level of the reproduced signal $S_{RF}$ to fall within a predetermined range as described above, the signal level detecting circuit of the invention is not limited to the peak detecting circuit and the present invention may utilize instead of the peak detecting circuit a signal detecting circuit which detects a mean value of the output signals of, for example, a variable gain amplifying circuit and so on.

While in the above embodiment the present invention is applied to the feedback-type automatic gain control circuit as described above, the present invention is not limited to the above feedback-type automatic gain control circuit and the present invention can be suitably applied to a feed forward-type automatic gain control circuit which controls a gain in response to the signal level of the input signal of the automatic gain control circuit.

Further, while the voltage controlled amplifying circuit of the multiplying circuit arrangement is employed in the above embodiment, the present invention is not limited to the above-mentioned voltage controlled amplifying circuit and the present invention can be applied to a wide variety of automatic gain control circuits. The variable gain amplifying circuit to which the present invention may be applied will be described later.

Furthermore, while the present invention is applied to the magnetic disk apparatus as described above, the present invention is not limited to the above-mentioned magnetic disk apparatus and the present invention can be applied to a wide variety of electronics apparatus.

As mentioned above, according to the present invention, since the gain of the voltage controlled amplifying circuit is determined by the current values of the constant current sources, the gain of the voltage controlled amplifying circuit can be held with high accuracy. Thus, even when the voltage controlled amplifying circuit of multiplying circuit arrangement is employed, it is possible to reduce the attack time.

Figure 7:
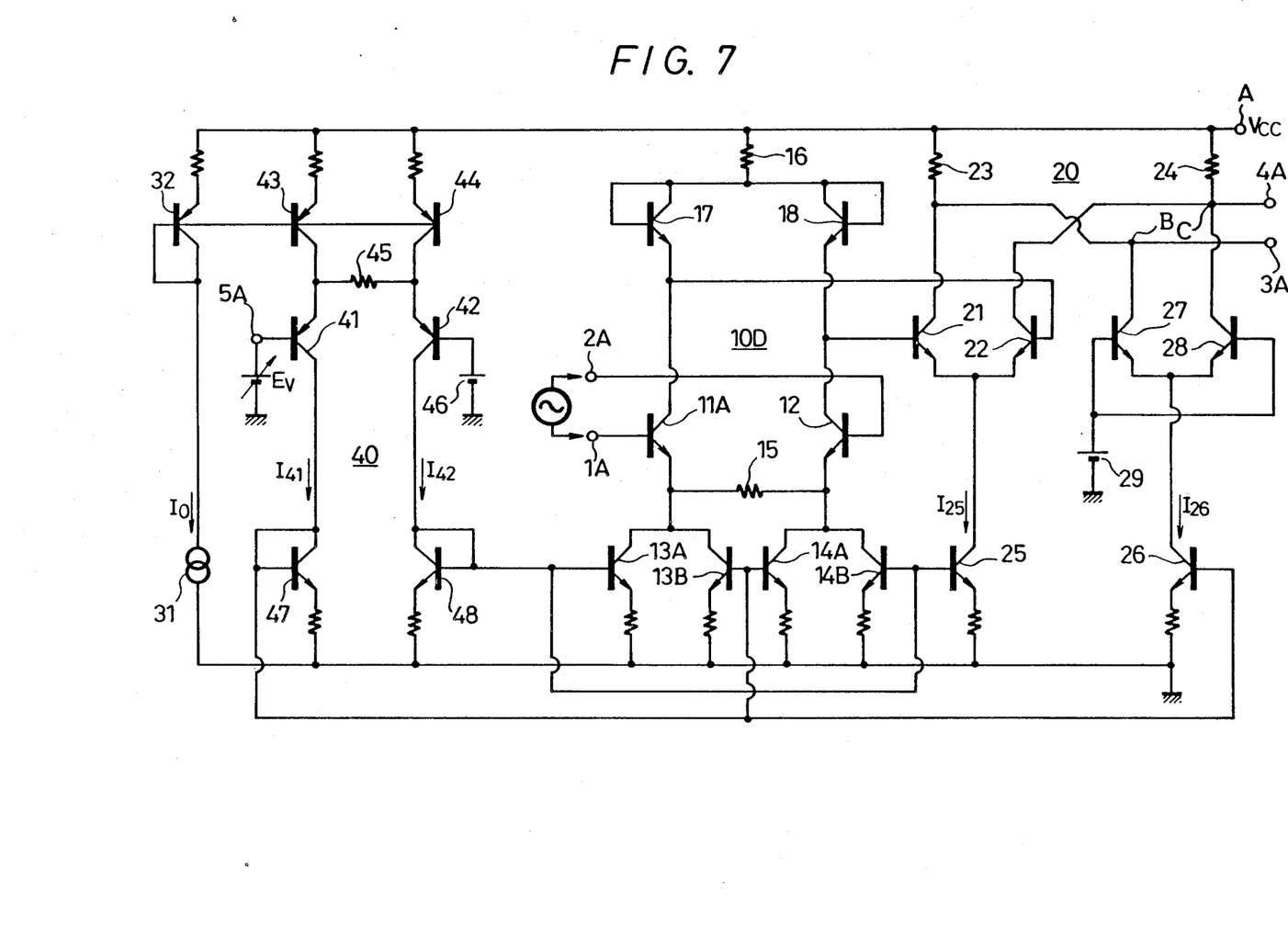
FIG. 7 is a schematic diagram showing an overall arrangement of the automatic gain control circuit shown in FIG. 6.

An embodiment of the above-mentioned variable gain amplifying circuit according to the present invention will hereinafter be described with reference to FIG. 7. In FIG. 7, like parts corresponding to those of FIG. 5 are marked with the same references and therefore need not be described in detail.

Referring to FIG. 7, there is provided a differential amplifier 10D of the first stage in which the emitters of the transistors 11A and 12 are respectively grounded via pairs of constant current source transistors 13A, 13B and 14A, 14B. The junction area of each of the transistors 13A to 14B is selected to be half of that of each of the transistors 13 and 14 shown in FIG. 5. The transistors 13A and 14B are commonly connected to a transistor 25 of the succeeding amplifier 20 and also are connected to a transistor 48 connected in a diode fashion of a current control circuit 40 so as to form a first current mirror circuit. Similarly, the transistors 13B and 14A are commonly connected to a transistor 26 of the succeeding amplifier 20 and are also connected to a diode-connected transistor 47 of the current control circuit 40 so as to form a second current mirror circuit. Other corresponding portions in FIG. 7 are formed similarly to those of FIG. 5.

The operation of this embodiment shown in FIG. 7 will be described hereinunder.

Collector currents $I_{41}$ and $I_{42}$ of the transistors 41 and 42 in the current control circuit 40 are differentially varied in response to the change of the control voltage $E_V$ as described before. A constant current of $I_{42}/2$ flows to the transistors 13A and 14B of the first differential amplifier 10D and a constant current of $I_{41}/2$ flows to the transistors 13B and 14A so that each of the collector currents $I_{11}$ and $I_{12}$ of the transistors 11A and 12 supplied with the input signal equals to a mean value of the collector currents of the transistors 41 and 42 in the current control circuit 40, which becomes equal to the reference current $I_0$ of the constant current source 31 as expressed by the following equation (12)

$$I_{11}=I_{12}=(I_{41}+I_{42})/2=I_0 \qquad (12)$$

According to this embodiment, the gain of the first differential amplifier 10D is fixed and the respective constant currents of the constant current source transistor pairs 13A, 13B and 14A, 14B reflect the characteristics of the transistors 41 and 42 of the current control circuit 40 similarly to the constant current source transistors 25 and 26 of the next amplifier 20 so that even when $h_{FE}$ fluctuates in a range of from 60 to 20, the fluctuation of the gain G can be suppressed, for example, to less than 0.1 dB.

As described above, according to this embodiment, the gain of the gain control circuit of the invention can be prevented from being affected by $h_{FE}$ of the differential transistors 41 and 42 of the current control circuit 40. In addition, since $h_{FE}$ fluctuates in response to the change of temperature, according to the present embodiment, the fluctuation of the gain due to the change of temperature can be suppressed, thus resulting in stability of gain being improved.

While in the above-mentioned embodiment the resistors 15 and 45 are respectively connected between the emitters of the differential transistors 11A, 12 in the amplifier 10D of the first stage and between the emitters of the differential transistors 41, 42, in the current control circuit 40, the amplifier 10D and the current control circuit 40 may be formed as a fundamental differential arrangement in which the emitters of the transistors 11, 12 and 41, 42 are directly connected.

As described above in detail, according to the present invention, since the two differential amplifiers are connected in cascade wherein the gain of the second differential amplifier is controlled by using one of the pairs of control currents differentially changed by the variable control voltage and the current values of the constant current sources of the first differential amplifier are equal to a sum of the pair of control currents, it is possible to obtain a gain control amplifier which can suppress the influence exerted by the characteristics of the transistors in the current control circuit generating the control current and in which the total gain is stabilized more effectively.

The variable gain control circuit 2 shown in FIG. 6 may be replaced with the gain control circuit shown in FIG. 7. More specifically, the collector outputs of the pair of the transistor pair Q111 and Q112 forming the differential amplifying circuit shown in FIG. 6 are connected to the bases of the pnp transistor pair 41 and 42 forming a portion of the current source shown in FIG. 7. In this case, it is to be noted that a direct current voltage adjusting circuit, for example, an emitter-follower circuit or the like is connected between the collectors of the transistors Q111, Q112 and the bases of the transistors 41, 42.

It should be understood that the above description is presented by way of example on a single preferred embodiment of the invention and it will be apparent that many modifications and variations could be effected by one with ordinary skill in the art without departing from the spirit and scope of the novel concepts of the invention so that the scope of the invention should be determined only by the appended claims.

We claim:

1. An automatic gain control circuit comprising:
   a variable gain amplifier circuit;
   a signal level detecting circuit connected to an output of said variable gain amplifier circuit for generating a detect signal having a level that changes in response to a signal level of said output; and
   a gain control circuit for controlling a gain of said variable gain amplifier circuit in accordance with the signal level of said detect signal and comprising a differential amplifier circuit having first and second input terminals, said first input terminal being connected to said signal level detecting circuit for receiving said detect signal;
   first reference voltage source means also connected to said first terminal of said differential amplifier for selectively providing a first predetermined voltage to said first terminal of said differential amplifier in response to said signal level of said detect signal; and
   a second reference voltage source connected to said second input terminal of said differential amplifier for providing a second predetermined voltage, whereby output signals from said differential amplifier are fed to said variable gain amplifier circuit.

2. The automatic gain control circuit according to claim 1, in which said first said reference voltage sources include first and second current source circuits, respectively.

3. The automatic gain control circuit according to claim 2, in which said differential amplifier includes a pair of NPN transistors.

4. The automatic gain control circuit according to claim 3, in which a control signal for controlling said gain of said variable gain amplifier circuit is output from a collector of said pair of transistors.

5. The automatic gain control circuit according to claim 1, in which said variable gain amplifier circuit includes a second differential amplifier circuit having corresponding first and second transistors and a first constant current source circuit a third differential amplifier circuit connected to said second differential amplifier having corresponding first and second transistors and a second constant current source circuit, from which an output signal is bed to said signal level detecting circuit, a current control circuit having differentially connected transistors, a base electrode of at least one of said transistors of said current control circuit is connected to an output terminal of said gain control circuit for producing first and second control currents which alternate differentially, a current amount of said first constant current source being equal to a sum of said first and second control currents, and a current amount of said second constant current source being equal to one of said first or second control currents so as to control a gain of said third differential amplifier.

6. The automatic gain control circuit according to claim 5, in which said first constant current source circuit includes a pair of fourth and fifth differential amplifiers.

7. The automatic gain control circuit according to claim 6, in which base electrodes of transistors of said fourth and fifth differential amplifiers are connected to each other.

* * * * *